United States Patent
Kawamura

(10) Patent No.: US 10,416,223 B2
(45) Date of Patent: Sep. 17, 2019

(54) GROUND FAULT DETECTION DEVICE

(71) Applicant: Yazaki Corporation, Tokyo (JP)

(72) Inventor: Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 16/141,462

(22) Filed: Sep. 25, 2018

(65) Prior Publication Data

US 2019/0128943 A1    May 2, 2019

(30) Foreign Application Priority Data

Nov. 1, 2017    (JP) .................................. 2017-211793

(51) Int. Cl.
*G01R 31/02* (2006.01)
*H01M 10/48* (2006.01)
*H02J 7/00* (2006.01)

(52) U.S. Cl.
CPC .......... *G01R 31/025* (2013.01); *H01M 10/48* (2013.01); *H02J 7/0029* (2013.01); *H01M 2220/20* (2013.01)

(58) Field of Classification Search
USPC .......................... 324/503, 509, 510, 551, 557
See application file for complete search history.

(56) References Cited

U.S. PATENT DOCUMENTS

| 8,106,667 B2* | 1/2012 | Kawamura | G01R 27/025 324/551 |
| 2008/0079404 A1* | 4/2008 | Hayakawa | G01R 19/16542 323/271 |
| 2014/0214262 A1* | 7/2014 | Iwanabe | G01R 31/025 701/31.7 |

FOREIGN PATENT DOCUMENTS

JP    2009-281986 A    12/2009

* cited by examiner

*Primary Examiner* — Vincent Q Nguyen
(74) *Attorney, Agent, or Firm* — Sughrue Mion, PLLC

(57) ABSTRACT

Provided is a ground fault detection device including a detection capacitor, a positive electrode power supply side resistor, a negative electrode power supply side resistor, a positive electrode ground side resistor, a negative electrode ground side resistor, a positive electrode side twin relay selectively switching a connection point of one end of the detection capacitor; a negative electrode side twin relay selectively switching a connection point of the another end of the detection capacitor, and a controller controlling switching of the positive electrode side twin relay and the negative electrode side twin relay, and calculating an insulation resistance of the system provided with the high-voltage battery based on a charging voltage of the detection capacitor, and determines there is a possibility that a sticking fault has occurred.

14 Claims, 10 Drawing Sheets

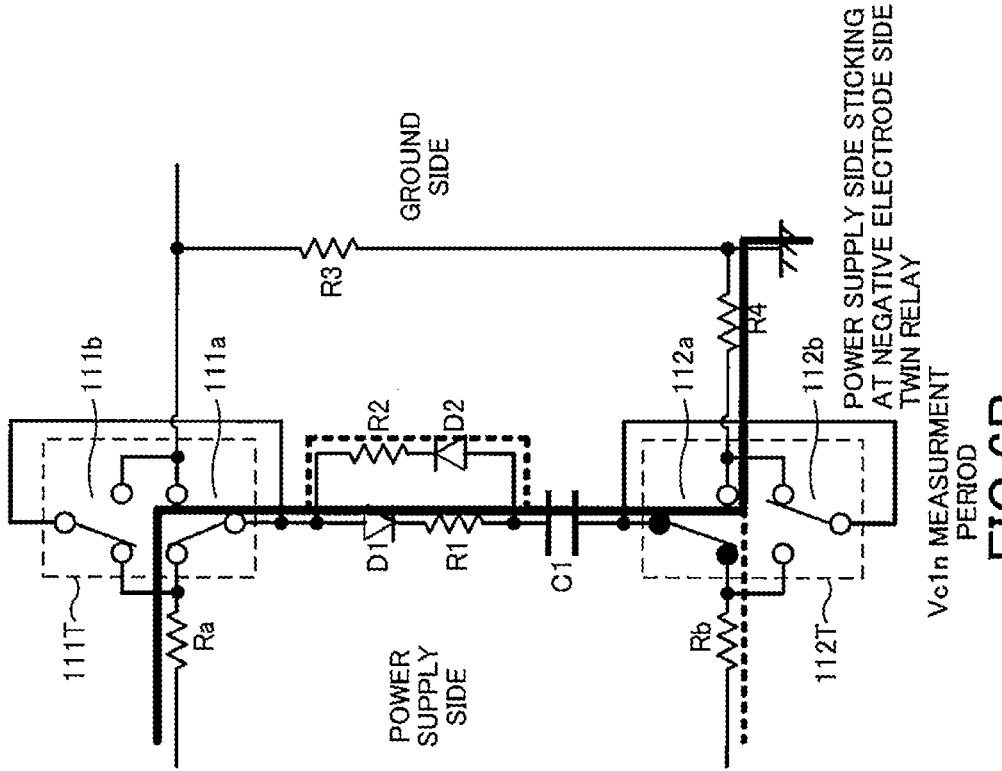
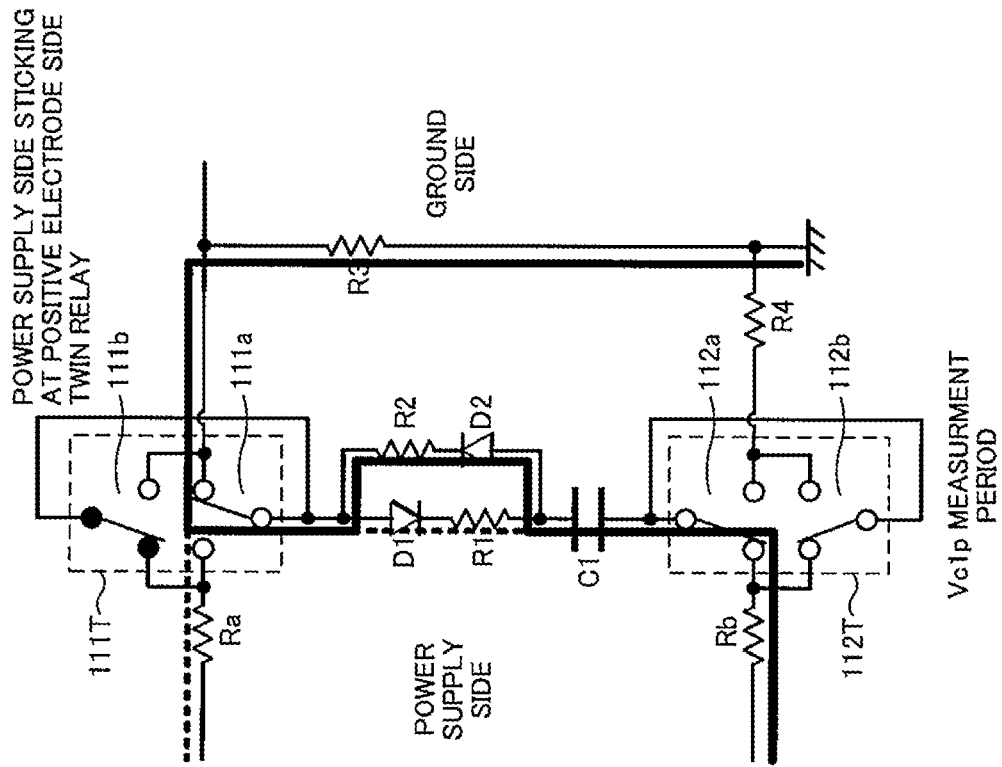
FIG.6A / FIG.6B

GROUND FAULT DETECTION DEVICE

TECHNICAL FIELD

The present invention relates to a ground fault detection device using a flying capacitor.

BACKGROUND ART

In a vehicle such as a hybrid vehicle having an engine and an electric motor as a drive source or electric vehicle, a battery mounted on a vehicle body is charged and driving force is generated using electric energy supplied by the battery. Generally, the battery-related power supply circuit is configured as a high-voltage circuit that handles high-voltage of 200 V or more, and the high-voltage circuit including the battery has an ungrounded configuration for ensuring safety, which is electrically insulated from the vehicle body that is the reference potential point of the ground.

In vehicles equipped with an ungrounded high-voltage battery, a ground fault detection device is provided in order to monitor an insulation state (ground fault) between a system provided with high-voltage battery, specifically a main power supply system leading from the high-voltage battery to a motor and the vehicle body. The ground fault detection device widely uses a method utilizing a capacitor called a flying capacitor.

FIG. 8 is a diagram showing a circuit example of a conventional ground fault detection device of the flying capacitor type. As shown in the figure, the ground fault detection device 400 is the device connected to the ungrounded high-voltage battery 300, and detects a ground fault of a system in which the high-voltage battery 300 is provided. Here, an insulation resistance between the positive electrode side and the ground of the high-voltage battery 300 is represented by RLp, and the insulation resistance between the negative electrode side and the ground thereof RLn. The combined resistance of the positive electrode side insulation resistance RLp and the negative electrode side insulation resistance RLn becomes an insulation resistance RL.

As shown in the figure, the ground fault detection device 400 is provided with a detection capacitor C1 operating as flying capacitor. In addition, in order to switch a measurement path, and control charging and discharging of capacitor C1, four switches S1 to S4 are provided around the detection capacitor C1. Furthermore, a switching element Sa for sampling a voltage for measurement corresponding to the charge voltage of the detection capacitor C1 is provided.

In the ground fault detection device 400, in order to calculate the insulation resistance RL, measurement operation is repeated as one cycle from V0 measurement period, Vc1n measurement period, V0 measurement period, to Vc1p measurement period. In any measurement periods, after charging the detection capacitor C1 with the voltage of the measurement target, the charging voltage of the capacitor C1 is measured. The detection capacitor C1 is discharged for the next measurement.

In the V0 measurement period, a voltage corresponding to the voltage of the high-voltage battery 300 is measured. For this reason, switching elements S1 and S2 are turned on, switching elements S3 and S4 are turned off, and the detection capacitor C1 is charged. That is, as shown in FIG. 9A, the high-voltage battery 300, a charge resistor R1, and the detection capacitor C1 becomes the measurement path.

At the time of measuring the charging voltage of the detection capacitor C1, as shown in FIG. 9B, the switching elements S1 and S2 are turned off while the switching elements S3 and S4 are turned on, the switching device Sa is turned on and sampling is performed by the control device 420. Thereafter, as shown in FIG. 9C, the switching element Sa is turned off and the detection capacitor C1 is discharged for the next measurement of the battery C1. When the charging voltage of the detection capacitor C1 is measured, the operation at the time of discharge of the detection capacitor C1 is the same in other measurement periods.

In the Vc1n measurement period, a voltage reflecting the influence of the negative electrode side insulation resistance RLn is measured. Thus, the switching elements S1 and S4 are turned on, the switching elements S2 and S3 are turned off, and the detection capacitor C1 is charged. That is, as shown in FIG. 10A, a path including the high-voltage battery 300, the charge resistor R1, the detection capacitor C1, the negative electrode ground side resistor R4, the ground, and the negative electrode side insulation resistance RLn becomes the measurement path.

In the Vc1p measurement period, a voltage reflecting the influence of the positive electrode side insulation resistance RLp is measured. Thus, the switching elements S2 and S3 are turned on, the switching elements S1 and S4 are turned off, and the detection capacitor C1 is charged. That is, as shown in FIG. 10B, a path including the high-voltage battery 300, the positive electrode side insulation resistance RLp, the ground, the positive electrode ground side resistor R3, the charge resistor R1, and the detection capacitor C1 becomes the measurement path.

It is known to obtain $(RLp \times RLn)/(RLp+RLn)$, based on $(Vc1p+Vc1n)/V0$ calculated from V0, Vc1n, and Vc1p obtained in these measurement periods. Therefore, the control device 420 in the ground fault detection device 400 calculates, by measuring V0, Vc1n and Vc1p, the insulation resistance RL that is the combined resistor of the positive electrode side insulation resistance RLp and the negative electrode side insulation resistance RLn. When the insulation resistance RL is less than the predetermined judgment reference level, it is judged that a ground fault has occurred, and an alarm is issued.

Patent Document

Patent Document 1: Japanese Patent Application Laid-Open No. 2009-281986

DISCLOSURE OF THE INVENTION

Problems to be Solved by the Invention

The conventional ground fault detection device is configured such that the switching elements S1 to S4 are replaced with four optical MOS-FETs that are insulating switching elements. However, since the optical MOS-FET is expensive, the cost of the ground fault detection device increases.

In view of the above, object of the present invention is to suppress the increase in cost caused by the switching element in a ground fault detection device using a flying capacitor.

Means for Solving the Problem

In order to solve the above problem, a ground fault detection device of the present invention is the ground fault detection device that is connected to an ungrounded high-voltage battery and detects a ground fault of a system provided with the high-voltage battery, the ground fault detection device includes: a controller; a detection capacitor operating as a flying capacitor; a positive electrode power supply side resistor configured to be connected to a positive electrode side of the high-voltage battery; a negative electrode power supply side resistor configured to be connected to a negative electrode side of the high-voltage battery; a positive electrode ground side resistor, one end of the positive electrode ground side resistor being grounded, a voltage of another end of the positive electrode ground side resistor being measured by the controller; a negative electrode ground side resistor, one end of the negative electrode ground side resistor being grounded; a positive electrode side twin relay connected in parallel with a relay for selectively switching a connection point of one end of the detection capacitor between a path including the positive electrode power supply side resistor and a path including the positive electrode ground side resistor; and a negative electrode side twin relay connected in parallel to a relay for selectively switching a connection point of another end of the detection capacitor between a path including the negative electrode power supply side resistor and a path including the negative electrode ground side resistor, and the controller controls switching of the positive electrode side twin relay and the negative electrode side twin relay, calculates an insulation resistance of the system provided with the high-voltage battery based on a charging voltage of the detection capacitor, and determines there is a possibility that a sticking fault on the power source side has occurred at the positive electrode side twin relay or the negative electrode side twin relay when the calculated insulation resistance can be regarded equal to a value of the positive electrode power supply side resistor or the negative electrode power supply side resistor.

Here, the controller calculates the insulation resistance a plurality of times when determined that there is the possibility that the sticking fault on the power source side has occurred at the positive electrode side twin relay or the negative electrode side twin relay, and determines that not the sticking fault but a ground fault has occurred when the calculated insulation resistance fluctuates.

Further, the controller calculates the insulation resistance a plurality of times when determined that there is the possibility that the sticking fault on the power source side has occurred at the positive electrode side twin relay or the negative electrode side twin relay, and determines the sticking fault on the power source side has occurred at the positive electrode side twin relay or the negative electrode side twin relay when the calculated insulation resistance remains stationary.

Further, upon calculating the insulation resistance, the controller measures the charging voltage of the detection capacitor when switching to a circuit including the positive electrode power supply side resistor and the negative electrode ground side resistor, and the charging voltage of the detection capacitor when switching to a circuit including the negative electrode power supply side resistor and the positive electrode ground side resistor, and, when any one of charging voltages is 0, determines that the sticking fault on the ground side has occurred at the positive electrode side twin relay or the negative electrode side twin relay.

Further, the controller, when determined that the sticking fault has occurred at the positive electrode side twin relay or the negative electrode side twin relay, further determines that there is a possibility of freezing.

Advantages of the Invention

According to the present invention, in a ground fault detection device using a flying capacitor, since optical MOS-FET causing cost increase is not used, the cost increase due to the switching element can be suppressed.

BRIEF DESCRIPTION OF THE DRAWINGS

FIGS. 6A and 6B are diagrams for explaining a case where a power source side sticking occurs in the twin relay;

MODE FOR CARRYING OUT THE INVENTION

Figure 1:
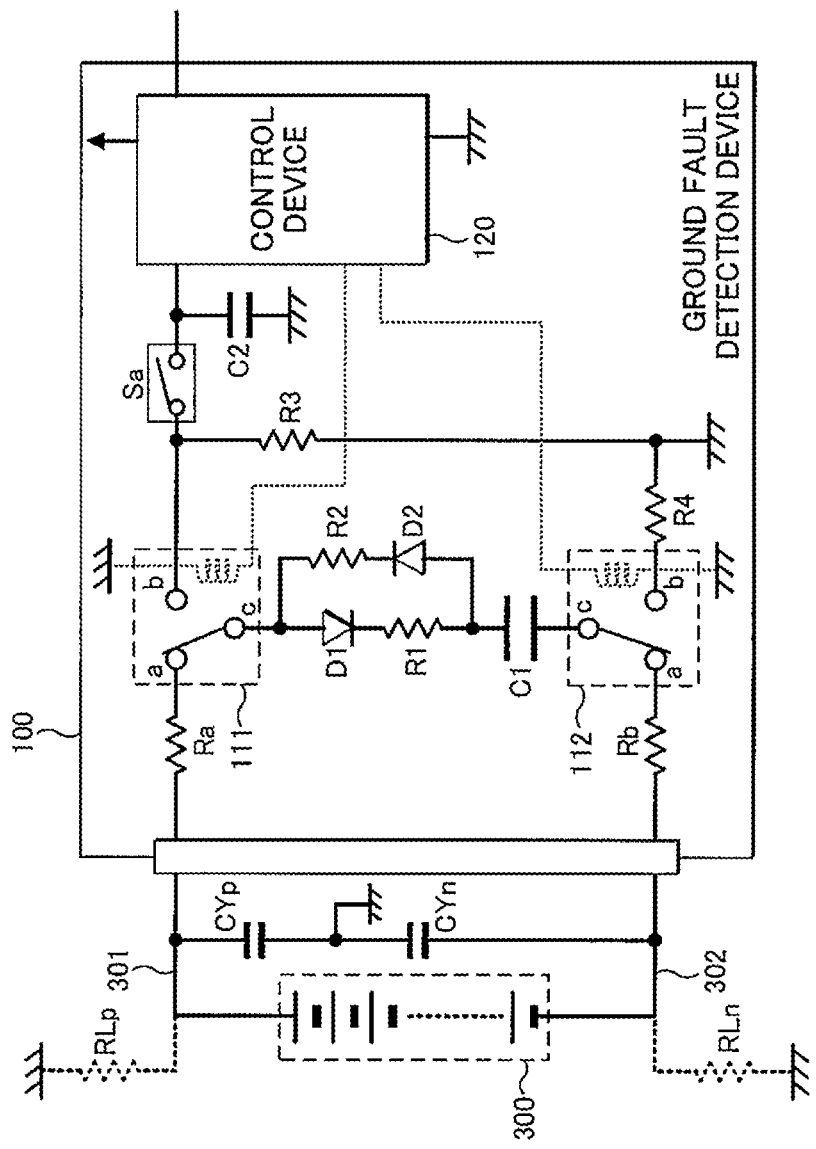
FIG. 1 is a block diagram showing a configuration of a ground fault detection device according to an embodiment of the present invention.

Embodiments of the present invention will be described in detail with reference to the figures. FIG. 1 is a block diagram showing a configuration of a ground fault detection device 100 according to a first embodiment. As shown in this figure, the ground fault detection device 100 is flying capacitor-typed device connected to an ungrounded high-voltage battery 300 and detecting a ground fault of a system in which a high-voltage battery 300 is provided. Here, an insulation resistance between a positive electrode side of the high-voltage battery 300 and the ground is represented as RLp, and the insulation resistance between the negative electrode side and the ground RLn. Note that the high-voltage means a voltage higher than a low-voltage battery (generally 12 V) for driving various devices (lamps, windshield wipers, etc.) in a vehicle, and a high-voltage battery 300 is a battery used for driving vehicle traveling.

The high-voltage battery 300 is constituted by a rechargeable battery such as a lithium ion battery, discharges via a high-voltage bus bar (not shown), and drives an electric motor connected via a main relay, an inverter etc. Also, during regeneration or when charging equipment is connected, the high-voltage battery 300 is charged through the high-voltage bus bar.

Between a positive electrode side power supply line 301 and a ground electrode and between a negative electrode side power supply line 302 and a ground electrode of the high-voltage battery 300 are connected capacitors CYp, CYn called a Y capacitor (line bypass capacitor), respectively, for removing high-frequency noise of a power source and stabilizing operation. However, the Y capacitor may be omitted.

As shown in the figure, the ground fault detecting device 100 is provided with a detection capacitor C1 operating as a flying capacitor, and also a switching element Sa for sampling a voltage for measurement equivalent to a charging voltage of the detection capacitor C1. However, the switching element Sa can be omitted. In addition, a control device 120 composed of a microcomputer or the like is provided. The control device 120 executes a preinstalled program to perform various controls that are necessary for the ground fault detection device 100 such as switching process to be described later.

Figure 9A:
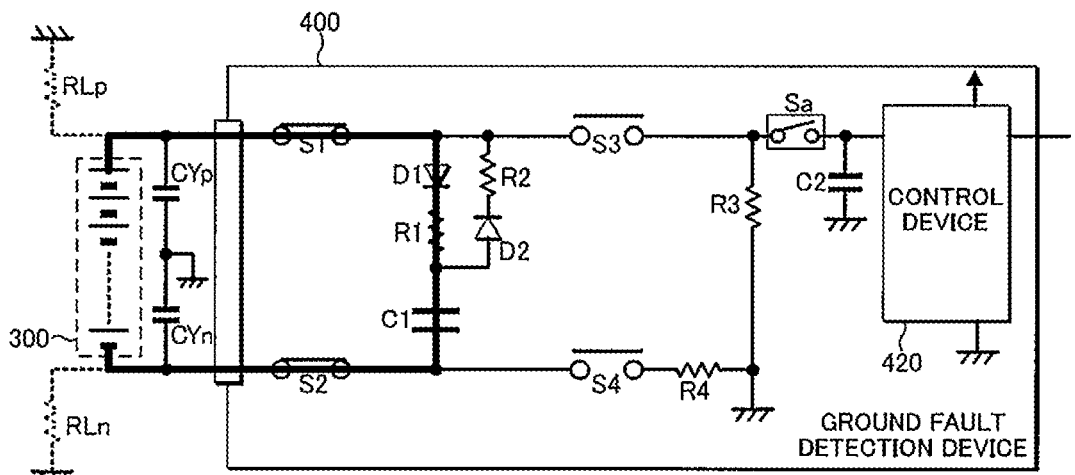
FIGS. 9A to 9C are views showing a measurement path in the V0 measurement period.
Figure 9B:
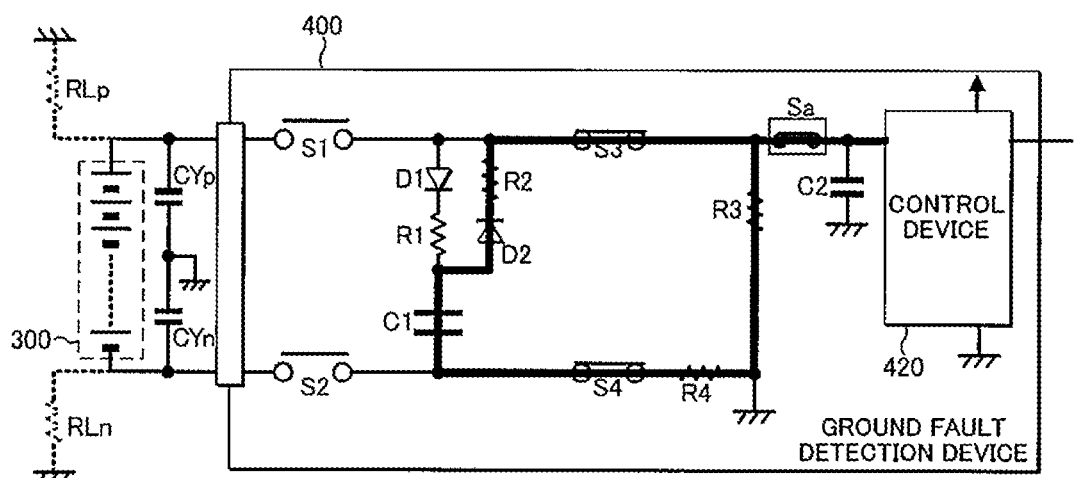
Figure 9C:
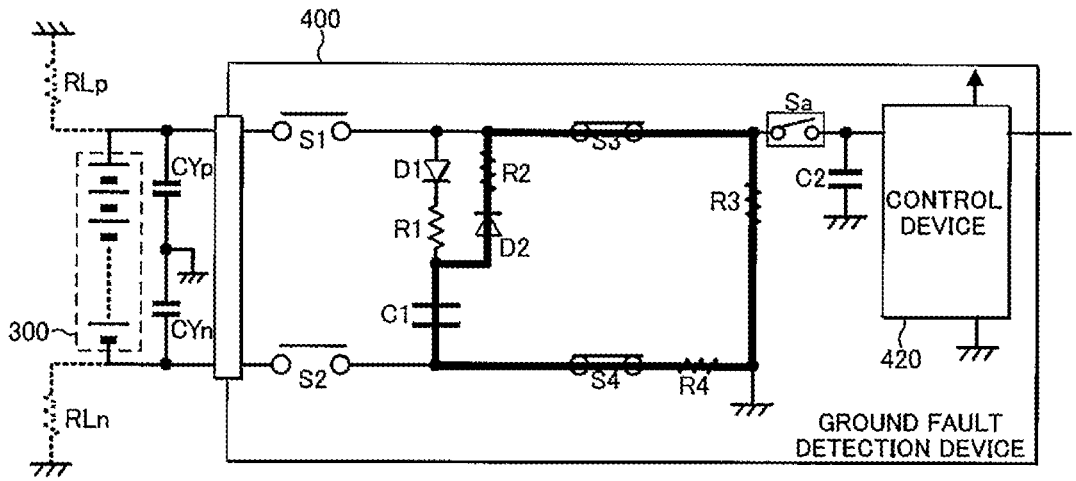
Figure 10A:
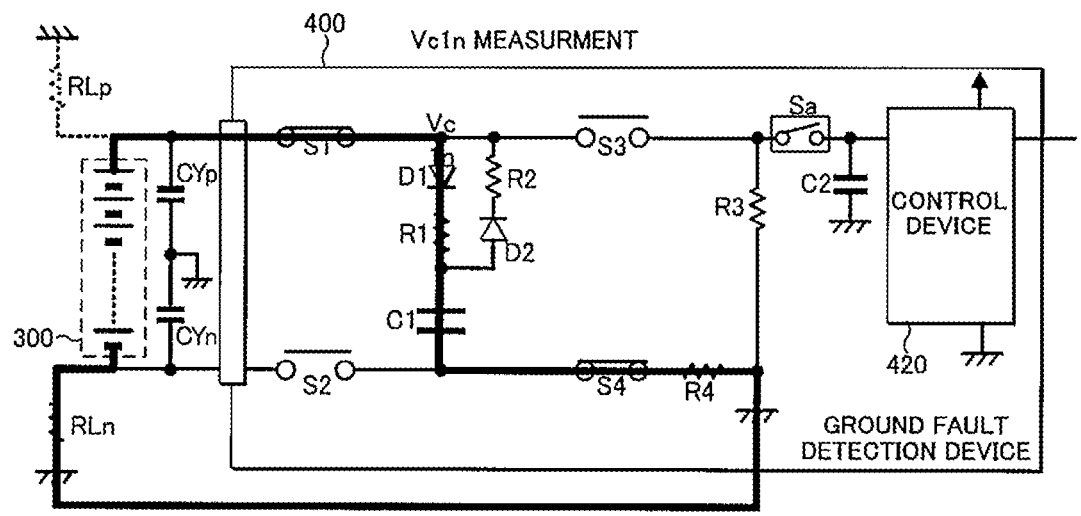
FIGS. 10A and 10B are diagrams showing the measurement path in a Vc1n measurement period and a Vc1p measurement period.
Figure 10B:
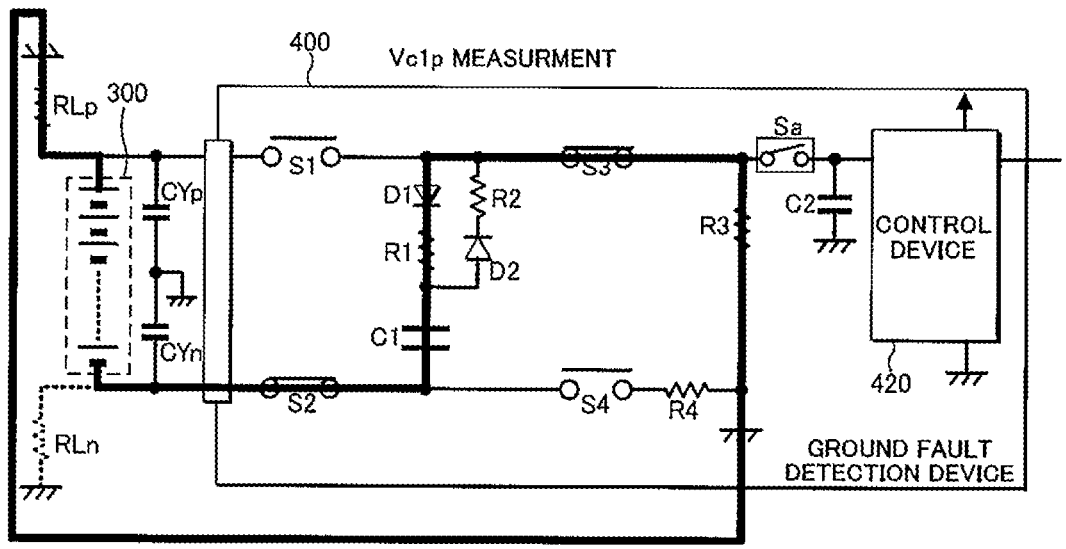

As described with reference to FIGS. 9A and 10B, in the measurement path in each measurement period, it does not occur that the switching element S1 and the switching element S3 of the positive electrode side power supply 301 system are simultaneously turned on and that the switching element S2 and the switching element S4 of the negative electrode side power supply line 302 system are simultaneously turned on. That is, the switching element S1 and the switching element S3 are exclusively switched, and the switching element S2 and the switching element S4 are exclusively switched.

Therefore, in the ground fault detection device 100, a positive electrode side C contact switch 111 is used as the switching elements of the positive electrode power supply line 301 system, and a negative electrode side C contact switch 112 is used as the switching element of the negative electrode side power supply line 302 system. The positive electrode side C contact switch 111 and the negative electrode side C contact switch 112 can be composed of a mechanical relay or a lead relay for high-voltage and small signal, for example.

Both the positive electrode side C contact switch 111 and the negative electrode side C contact switch 112 have a common contact c arranged on the side of the detection capacitor C1. Specifically, the common contact c of the positive electrode side C contact switch 111 is connected to a positive electrode side electrode plate of the detection capacitor C1 via a parallel circuit of a path of a diode D1 and a charge resistor R1 and a path of a discharge resistor R2 and a diode D2, and a common contact c of the negative electrode side C contact switch 112 is connected to a negative electrode side electrode plate of the detection capacitor C1. The diode D1 that becomes a pass in charging is connected in a direction in which from the positive electrode side C contact switch 111 to the detection capacitor C1 becomes a forward direction, and the diode D2 that is a path at the time of discharging is connected in an opposite direction.

A contact a of the positive electrode side C contact switch 111 is connected to the positive electrode side power supply line 301 via the positive electrode power supply side resistor Ra, and a contact a of the negative electrode side C contact switch 112 is connected to the negative electrode side power supply line 302 via the negative electrode power supply side resistor Rb. That is, both C contact switches are set as contact a on the side of the high-voltage battery 300.

A contact b of the positive electrode side C contact switch 111 is connected to the switching element Sa, and the positive electrode ground side resistor R3 of which the other end is grounded. The contact b of negative electrode side C contact switch 112 is connected to the negative electrode ground side resistor R4 of which the other end is grounded. In other words, both the C contact switches are set as contact b on the side of the control device 120 (ground side).

As shown in FIG. 1, the positive electrode C contact switch 111 and the negative electrode side C contact switch 112 are independently controlled by the control device 120. The control device 120 controls the positive electrode side C contact switch 111, the negative electrode side C contact switch 112, and the switching element Sa independently, thereby switching the measurement path, charging and discharging the detection capacitor C1, and measuring charging voltage.

Specifically, during the V0 measurement period, the positive electrode side C contact switch 111 and the negative electrode side C contact switch 112 are switched to the contact a side, and thereby forming measuring path passing the high-voltage battery 300, the positive power source side resistor Ra, the charge resistor R1, the detection capacitor C1, and the negative electrode power supply side resistor Rb.

At the time of measuring the charging voltage of the detecting capacitor C1, the positive electrode side C contact switch 111 and the negative electrode side C contact switch 112 are also switched to the contact "b" side and the switching element Sa is turned on. Then, the switching element Sa is turned off and the detection capacitor C1 is discharged mainly using a discharge resistor R2 for the next measurement. The operation when the charging voltage of the detection capacitor C1 is measured or at the time of discharge is the same in other measurement periods.

In the Vc1n measurement period, the positive electrode side C contact switch 111 is connected to the contact a side, and the negative electrode side C contact switch 112 the contact b side, thereby forming a measurement path passing the high-voltage battery 300, the positive electrode power supply side resistor Ra, the charge resistor R1, the detection capacitor C1, the negative electrode ground side resistor R4, the ground, and the negative electrode side insulation resistor RLn.

In the Vc1p measurement period, the positive electrode side C contact switch 111 is connected to the contact b side, and the negative electrode side C contact switch 112 the contact a side, thereby forming a measurement path passing the high-voltage battery 300, the positive electrode side insulation resistor RLp, the ground, the positive electrode ground side resistor R3, the charge resistor R1, the detection capacitor C1, and the negative electrode power supply side resistor Rb.

In the ground fault detection device 100, the positive electrode power supply side resistor Ra, the negative electrode power supply side resistor Rb, and the charge resistor R1 have high resistance of, for example, about several hundred kΩ, the discharge resistor R2, the positive electrode ground side resistor R3, and the negative electrode ground side resistor R4 have, for example, low resistance of several kΩ.

Because, apart from the charge resistor R1, the positive electrode power supply side resistor Ra is disposed on the positive electrode side, and the negative electrode power supply side resistor Rb on the negative electrode side, and the positive electrode C contact switch 111 and the negative electrode side C contact switch 112 consist of the C contact relay, even if sticking occurs with any C contact switch, current limit is applied between the high-voltage battery 300 and the control device 120 via any one of the positive electrode power source side resistor Ra and the negative electrode power supply side resistor Rb having high resistor. Therefore, the control device 120 and an energizing circuit can be protected.

Furthermore, even if the contacts a and b are short-circuited by any C contact switch, current limit is applied between the high-voltage battery 300 and the control device 120 via any one of the positive electrode power supply side resistor Ra and the negative electrode power supply side resistor Rb having high resistor, so that the control device 120 can be protected.

In addition, assuming the reference value for judging the ground-fault with respect to the positive electrode side insulation resistor RLp and the negative electrode side insulation resistor RLn as RLs, when the positive electrode side insulation resistance RLp and the negative electrode side insulation resistance RLn become the reference value RLs, setting each resistor value in the relation of $$R1+Ra+Rb=R1+R4+Ra+RLn=R1+R3+Rb+RLp$$

so that the resistor values on the path in the V0 measurement period, the Vc1n measurement period, and the Vc1p measurement period are equal, can prevent the ground fault detection accuracy from decreasing due to the influence of the DC bias characteristic even in the case of using a ceramic capacitor for the detection capacitor C1.

As described above, since the ground fault detection device 100 of the present embodiment does not use the optical MOS-FET which causes the cost increase for the changeover switch of the measurement path for the ground fault detection, it is possible to suppress an increase in cost caused by the switching element.

Figure 2:
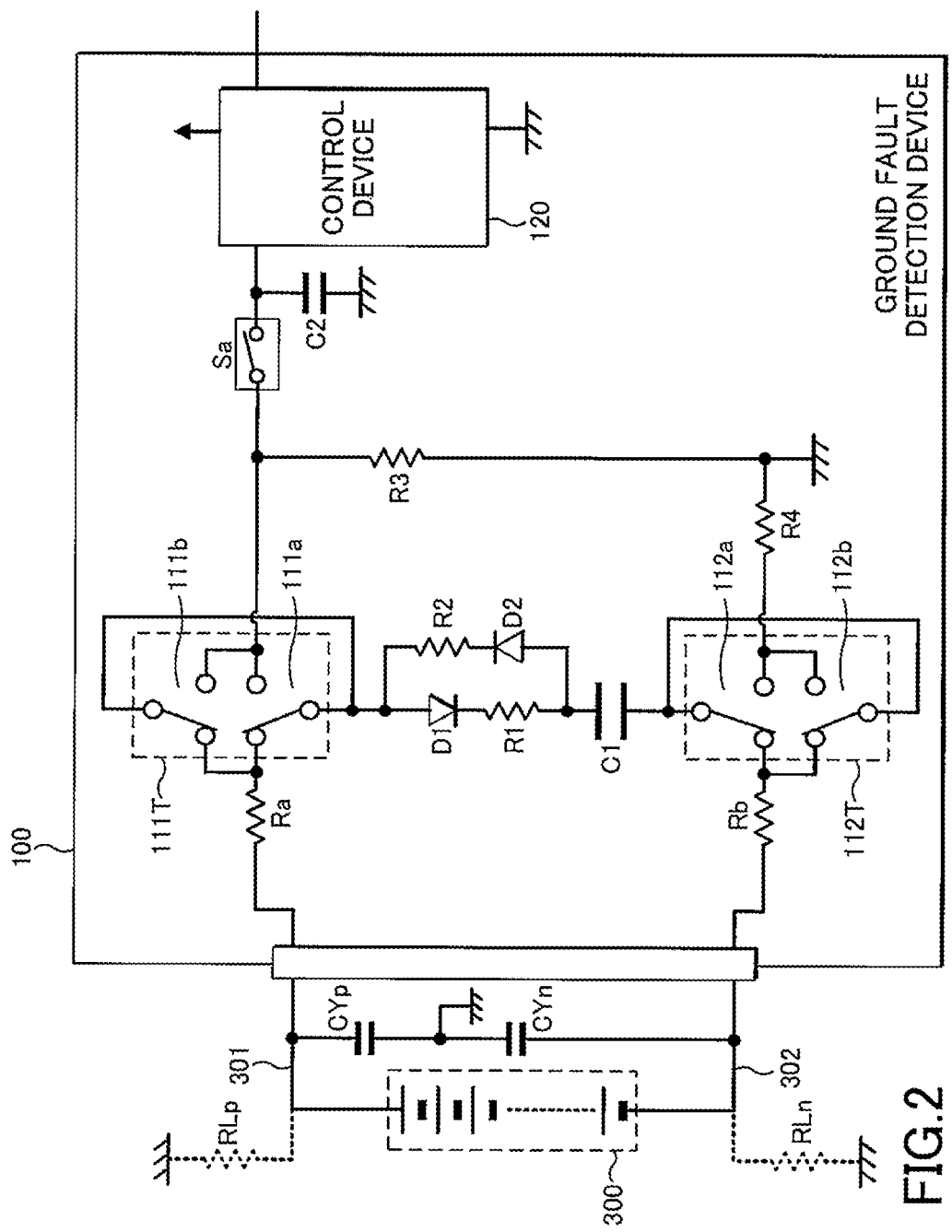
FIG. 2 is a diagram showing a first circuit example using a twin relay for a C contact switch.

By the way, since the C contact switch has a mechanical contact configuration, there is a limit on the number of times of opening and closing durability. In particular, the larger the energizing current or the applied voltage, the greater the influence on the opening and closing durability. Here, in order to improve the number of times of opening and closing durability, as shown in FIG. 2, the positive electrode side C contact switch 111 is constituted by the positive electrode side twin relays 111T (111*a*, 111*b*) which simultaneously switches by one control, and the negative electrode side C contact switch 112 is constituted by the negative electrode side twin relays 112T (112*a*, 112*b*) which simultaneously switches by one control, and a path is provided in which current branches in parallel into individual relays of twin relays.

As a result, the energizing current of each C contact switch is shunted, so that current load of the C contact switch can be reduced. For the twin relay, for example, a relay of one coil 2C contact can be used. The switching control for the positive electrode side twin relay 111T and the negative electrode side twin relay 112T is similar to the above-described positive electrode side C contact switch 111 and negative electrode side C contact switch 112.

In this case, the shunt ratio of the relays connected in parallel with each other is based on a minute contact resistance of the of the relays constituting the twin relay, and the load may be thus biased to one relay due to individual variation etc.

Figure 3:
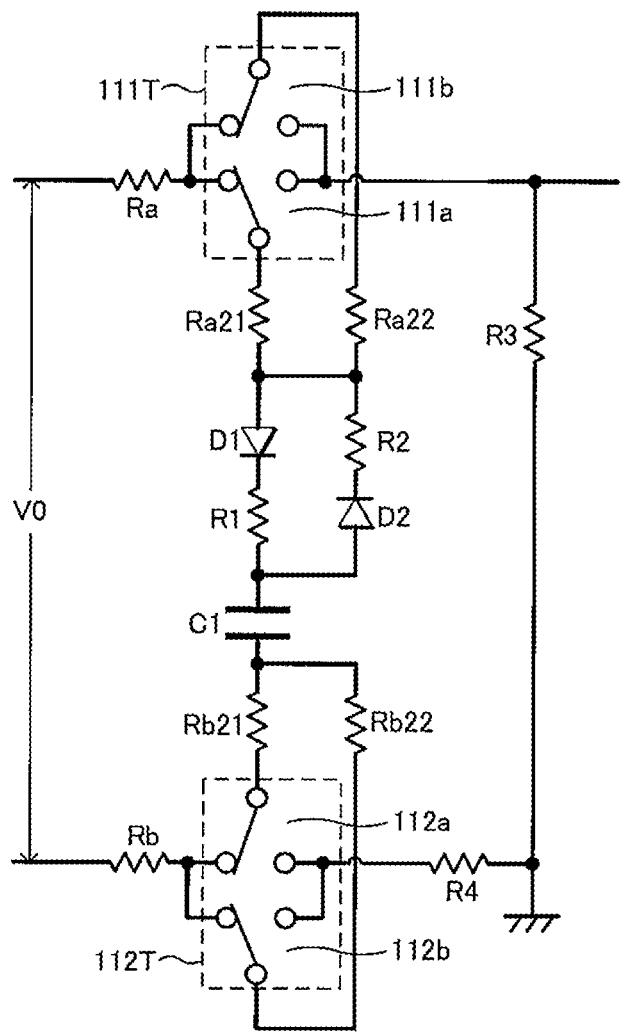
FIG. 3 is a diagram showing a second circuit example using a twin relay for the C contact switch.

Therefore, as shown in FIG. 3, a small shunt resistor may be connected to the contact c side path of each relay. In this case, since the shunt ratio is almost based on the shunt resistor, it is possible to prevent unbalance of load on one relay constituting the twin relay by equalizing the shunt resistor values.

In the example shown in this figure, a shunt resistor Ra21 (<<R1) is connected to the path of the relay 111*a*, and a shunt resistor Ra22 (=Ra21) is connected to the path of relay 111*b*, which constitute the positive electrode side twin relay 111T. Further, the shunt resistor Rb21 (<<R1) is connected to the path, and the shunt resistor Rb22 (=Rb21) is connected to a path of the relay 112*b*, which constitute the negative electrode side twin relay 112T.

Figure 4:
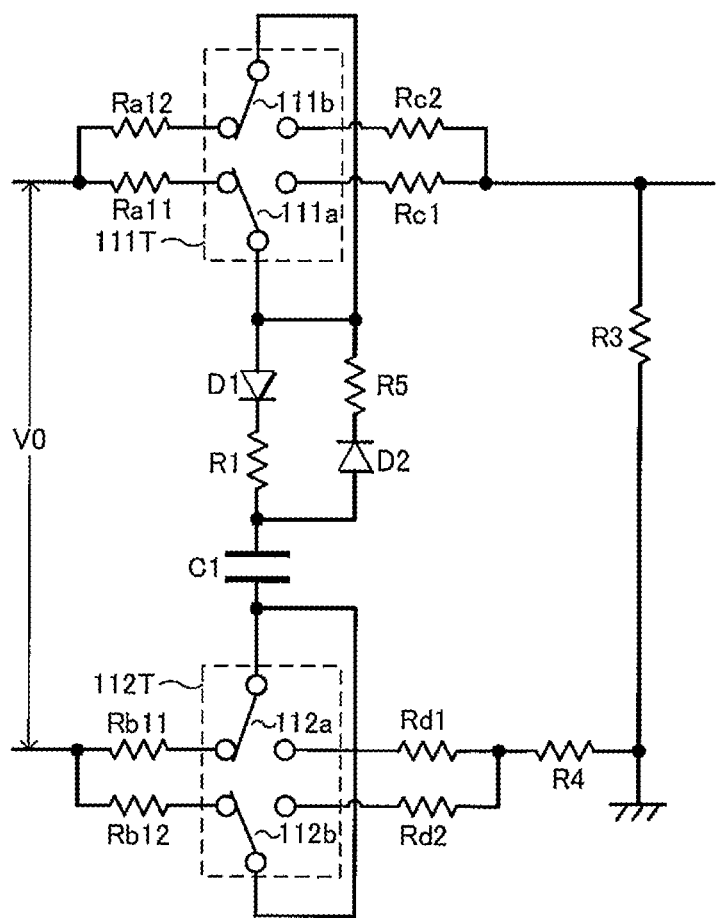
FIG. 4 is a diagram showing a third circuit example using a twin relay for the C contact switch.

Also, as shown in FIG. 4, shunt resistors may be provided on the contact a side path and the contact b side path of each relay. In the example of this figure, a resistor Ra11 is connected to the contact a side of the relay 111 *a*, a resistor Ra12 is connected to the contact a side of the relay 111 *b*, a resistor Rc1 is connected to the contact b side of the relay 111*a*, and a resistor Rc2 is connected to the contact b side of the relay 111*b*. Further, a resistor Rb11 is connected to the contact a side of the relay 112*a*, a resistor Rb12 is connected to the contact a side of the relay 112*b*, a resistor Rd1 is connected to the contact b side of the relay 112*a*, and a resistor Rd2 is connected to the contact b side of the relay 112*b*.

Here, a relationship is made as follows: resistor Ra11=resistor Ra12=resistor Rb11=resistor Rb12>>resistor Rc1=Resistor Rc2=resistor Rd1=resistor Rd2>>contact resistor of the relay resistor.

In the example of this figure, furthermore, the parallel resistor of the resistor Ra11 and the resistor Ra12 also play the role of the positive electrode power supply side resistor Ra, the parallel resistor of the resistor Rb11 and the resistor Rb12 also play the role of negative electrode power supply side the resistor Rb. Therefore, in the case of making the same resistor as in FIG. 1, a relationship is made as follows: resistor Ra11=resistor Ra12=resistor Rb11=resistor Rb12=2× positive electrode power supply side resistor Ra=2× negative electrode power supply side resistor Rb.

As a result, even if any of the relays are stuck or shorted, the energizing current is limited by the resistor Ra11, the resistor Ra12, the resistor Rb11, and the resistor Rb12. For this reason, in addition to being able to protect the control device 120, the current flowing through the measurement path increases and ground fault detection due to small resistor being detected insulation can be prevented from wrongly occurring. The resistors Rc1, the resistor Rc2, the resistor Rd1, and the resistor Rd2 may be used instead of the resistors Ra21, Ra22, Rb21, and Rb22.

Next, switch fault detection in the case of using a twin relay will be described. With twin relay, a parallel circuit is formed at the switch portion. For this reason, when a sticking fault occurs in one of the relays constituting the twin relay, a closed circuit different from the normal case is simultaneously formed, and a situation different from merely always-on and always-off may thus occur. In the following, the circuit shown in FIG. 2 is explained as an example, the circuit using the twin relay shown in FIG. 3 or FIG. 4 is similar as well.

Figure 5B:
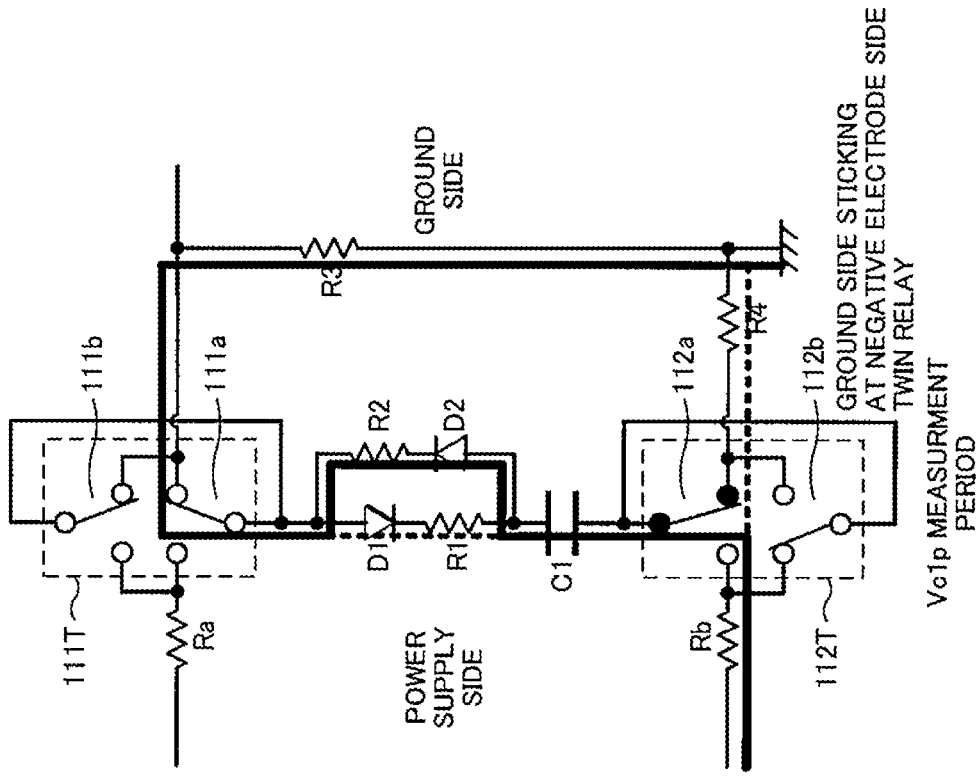
FIGS. 5A and 5B are views for explaining a case where a ground side sticking occurs in the twin relay.
Figure 5A:
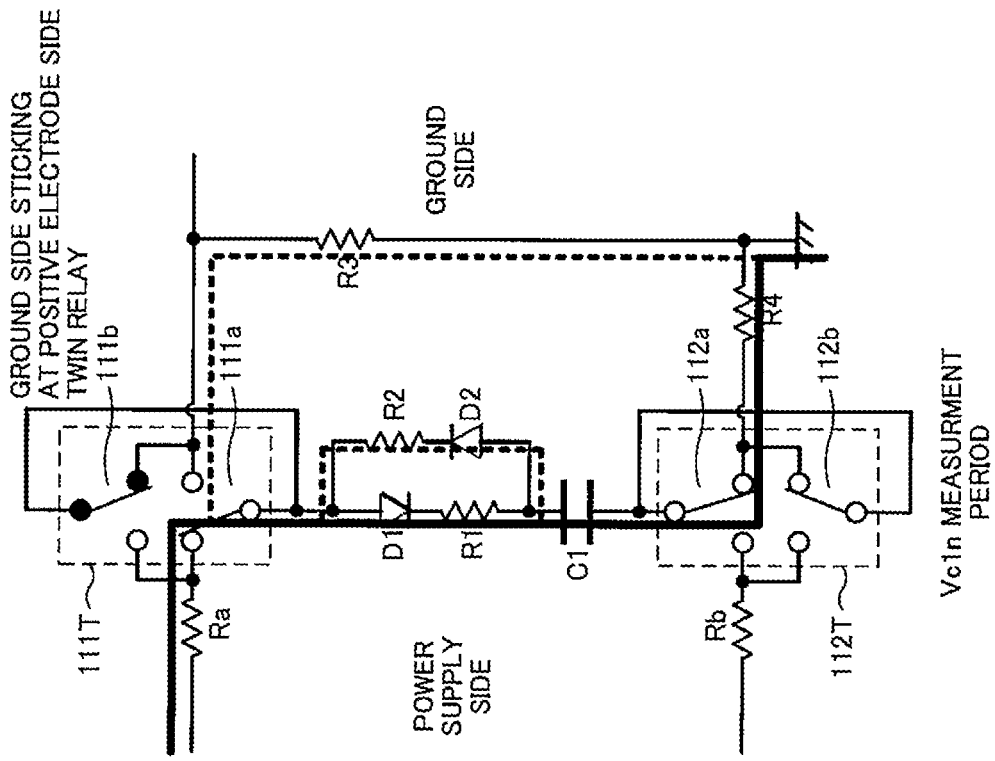

For example, as shown in FIG. 5A, ground side sticking (indicating the stuck state with the black circle of the switch) occurs at one of the relays of the positive electrode side twin relay 111T, a circuit indicated by a thick broken line is formed in addition to a normal circuit indicated by a bold solid line in the Vc1n measurement period for controlling switching the positive electrode side twin relay 111T to the power supply side and the negative electrode side twin relay 112T to the ground side.

At this time, since a closed circuit for discharging the detection capacitor C1 is formed on the ground side, the charging voltage of the capacitor C1 becomes 0V. In the Vc1n measurement period, boosting is performed on the main path of the high-voltage battery 300 (not shown) and the charging voltage of the detecting capacitor C1 never becomes 0V other than a case that the current wraps around from the secondary side.

Further, as shown in FIG. 5B, when ground side sticking occurs at one relay of the negative electrode side twin relay 112T, a circuit indicated by a thick broken line is formed in addition to the normal circuit indicated by the bold solid line in the Vc1p measurement period for controlling switching the positive electrode side twin relay 111T to the ground side, the negative electrode side twin relay 112T to the power supply side.

At this time, since a closed circuit for discharging the detection capacitor C1 is formed on the ground side, the charging voltage of the capacitor C1 becomes 0V. In the Vc1p measurement period, the charging voltage of the detection capacitor C1 never usually becomes 0V.

On the other hand, as shown in FIG. 6A, when power supply side sticking occurs at one of the relays of the positive electrode side twin relay 111T, a circuit indicated by a thick broken line is formed in addition to the normal circuit indicated by the bold solid line in the Vc1p measurement period for controlling switching the positive electrode side twin relay 111T to the ground side, and the negative electrode side twin relay 112T to the power supply side.

In this case, the positive electrode side electrode plate of the detection capacitor C1 is connected to the positive electrode of the high-voltage battery 300 via the power source side resistor Ra, in parallel with the positive electrode side insulation resistance RLp. Therefore, when actual positive electrode side insulation resistance RLp is sufficiently large, the value of the positive electrode power source side resistor Ra is calculated as the insulation resistance RL.

Even when measuring the charging voltage of the detecting capacitor C1, the positive electrode of the high-voltage battery 300 is in a state of being connected to the positive electrode plate of the detection capacitor C1 via the sticking relay, but the positive electrode ground side resistor R3 and the negative electrode ground side resistor R4 are sufficiently smaller than the positive electrode power supply side resistor Ra, so that the influence on the value is small.

Further, as shown in FIG. 6B, when power supply side sticking occurs at one of the relay of the negative electrode side twin relay 112T, a circuit indicated by a thick broken line is formed in addition to the normal circuit indicated by the bold solid line in the Vc1n measurement period controlling switching the positive electrode side twin relay 111T to the ground side, and the negative electrode side twin relay 112T to the power supply side.

In this case, the negative electrode side electrode plate of the detection capacitor C1 is connected to the negative electrode of the high-voltage battery 300 via the negative electrode power supply side resistor Rb, in parallel with the negative electrode side insulation resistance RLn. For this reason, when the insulation resistor RLn is sufficiently large, the value of the negative electrode power supply side resistor Rb is calculated as the insulation resistance RL.

Figure 7:
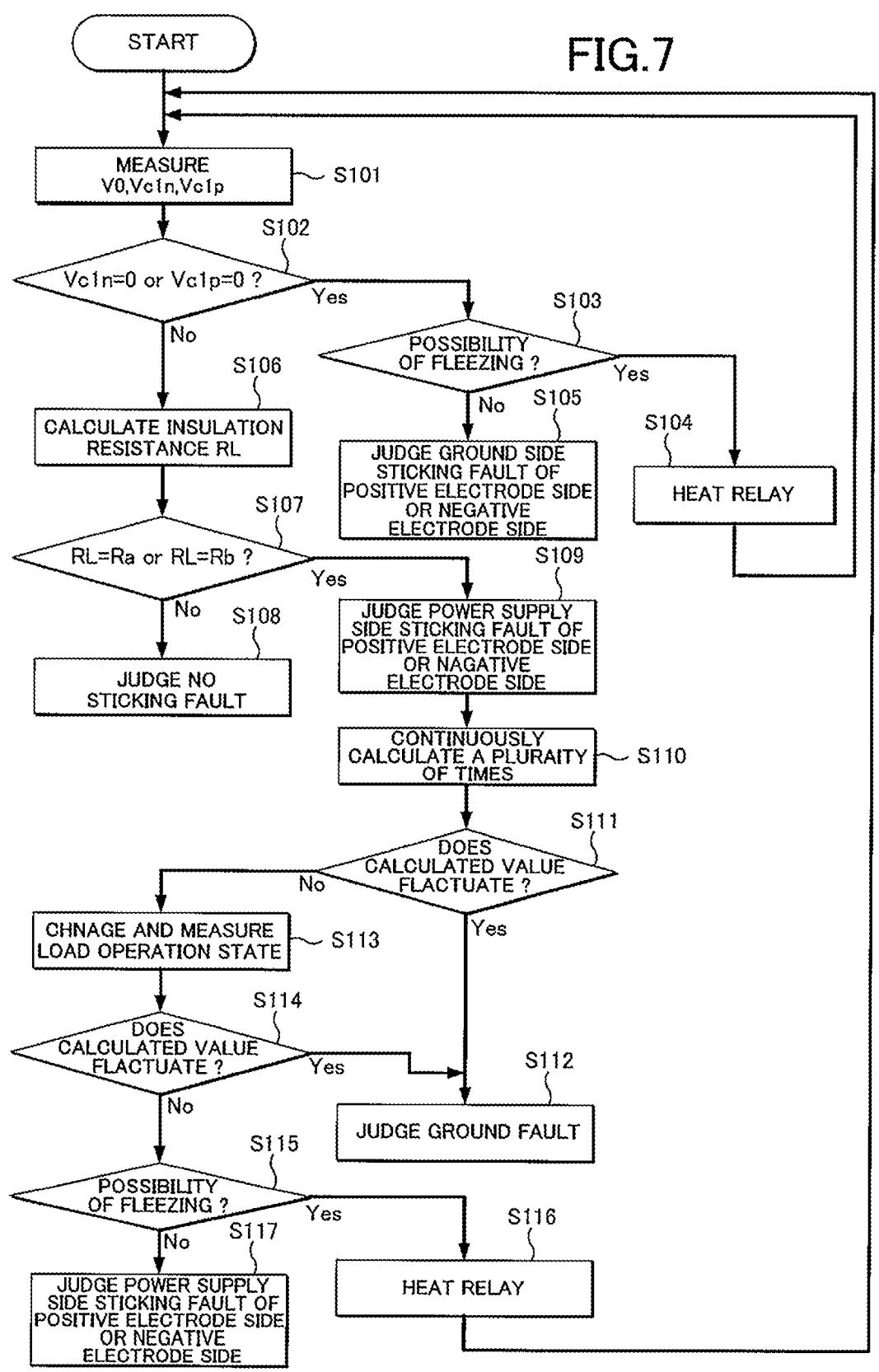
FIG. 7 is a flowchart explaining switch fault detection processing of the ground fault detection device using a twin relay.
Figure 8:
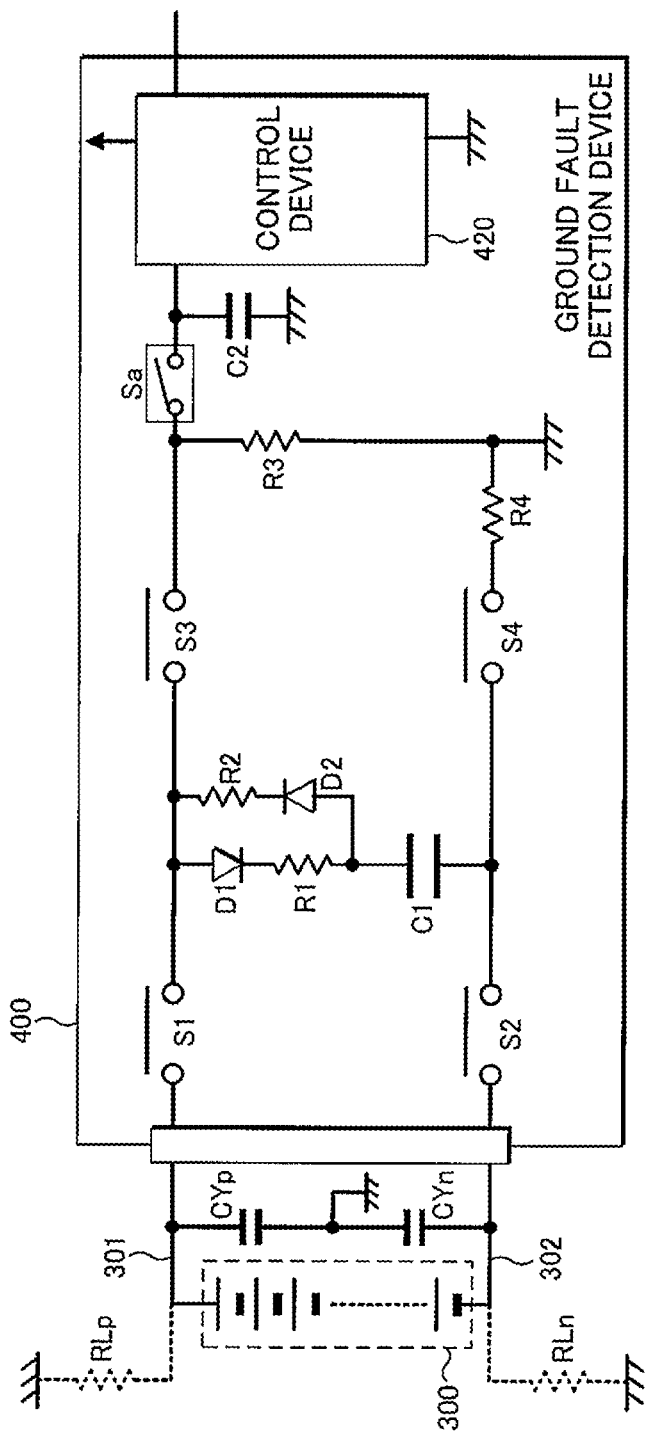
FIG. 8 is a diagram showing a circuit example of a conventional ground fault detection device of a flying capacitor type.

From the above, the ground fault detection device 100 using the twin relay can perform a switch fault detection processing as shown in FIG. 7. The switch fault detection processing is performed by control of the control device 120. The switch fault detection processing is performed as a series of ordinary ground fault judge processing. Of course, a switch fault detection mode is provided and normal ground fault judge processing may be executed separately. Further, the switch fault detection processing can be executed only with ordinary measuring circuits without providing a dedicated circuit.

In the switch fault detection processing, in accordance with the normal measurement cycle, V0, Vc1n, Vc1p are measured (S101). It is noted that the boosting of the high-voltage battery 300 is not performed here.

If Vc1n obtained by measurement is 0 V or Vc1p is 0 V (S102: Yes), it is determined that the ground side sticking has occurred in the twin relay. It is here determined that when Vc1n is 0 V, the ground side sticking occurs in the positive electrode side twin relay 111T, and when Vc1p is 0 V, the ground side sticking has occurred in the negative electrode side twin relay 112T.

On the other hand, although sticking has occurred, sticking due to freezing but not sticking fault has occurred. Therefore, when there is a possibility of freezing (S103: Yes), the relay is heated (S104) and is measured again (S101). Here, the possibility of freezing, for example, can be determined when the temperature is 0° C. or lower. Also, since freezing tends to occur when the temperature change is large, it may be determined that there is a possibility of freezing when the temperature is 0° C. or lower and the temperature change from the previous time is equal to or more than the predetermined reference value. In addition, it can be determined that there is no possibility of freezing even when the degree is 0° C. or less and the relay is already warming. The heating of the relay can be performed, for example, using heating of the coil due to energization of the relay.

If there is no possibility of freezing (S103: No), it is determined that the ground side sticking fault has occurred at the twin relays (S105). Specifically, it is determined that when Vc1n is 0 V, the ground side sticking fault has occurred at the positive electrode side twin relay 111T, and when Vc1p is 0 V, the ground side sticking fault has occurred at the negative electrode side twin relay 112T.

If Vc1n and Vc1p obtained by measurement are not 0 V (S102: No), the insulation resistance RL is calculated (S106) through the normal procedure. When the calculated insulation resistance RL is not equal to any one of the positive electrode power supply side resistor Ra and the negative electrode power source side resistor Rb (S107: No), it is determined that there is "no sticking fault" (S108).

At this time, the calculated insulation resistance RL can also be handled as correct. Furthermore, the determination as to whether they are equal or not equal is not strict, and for example, if a number of digits is the same and the most significant digit is near or similar, they can be regarded as equal. Also, for implementing, since it is preferable to make the positive electrode power supply side resistor Ra=the negative electrode power supply side resistor Rb, it is sufficient to actually compare with either one.

When the calculated insulation resistance RL is equal to either the positive electrode power supply side resistor Ra or the negative electrode power supply side resistor Rb (S107: Yes), there is a possibility that the sticking fault has occurred at the power supply side twin relay 111T, and when the calculated insulation resistance RL is equal to the positive power source side resistor Ra, there is a possibility that the ground side sticking has occurred at the negative electrode side twin relay 111T, and when the calculated insulation resistance RL is equal to the negative electrode power source side resistor Rb, there is a possibility that the ground side sticking has occurred at the negative electrode side twin relay 112T.

However, none of the relays are stuck, and the insulation resistance RL may actually be reduced to the value of the positive electrode power supply side resistor Ra or the negative electrode power supply side resistor Rb. For this reason, although it may be possible to issue a warning of the ground fault occurrence, the following discrimination processing is further performed in the present embodiment.

That is, when a ground fault actually occurs, the insulation resistance RL is likely to fluctuate. For this reason, repeating measurement of V0, Vc1n, Vc1p, the resistor RL is continuously calculated a plurality of times (S110). Then, if the calculated insulation resistance RL fluctuates (S111:

Yes), it is determined that the switch fault of relay sticking does not occur, the insulation resistance, and the ground fault state is established in which insulation resistance RL has decreased to the value of the positive electrode power supply side resistor Ra or the negative electrode power supply side resistor Rb (S112).

If the calculated insulation resistance RL does not fluctuate (S111: No), changing load operating state of the high-voltage battery 300, V0, Vc1n, and Vc1p are measured, and the insulation resistance RL is measured (S113). Here, the change of the load operation state is performed, for example, by turning on a main relay, switching on/off of the inverter, and the like.

Then, if the calculated insulation resistance RL fluctuates (S114: Yes), it is determined that the switch fault of the relay sticking has not occurred and the ground fault state is established in which the insulation resistance RL has decreased to the value of the positive electrode power supply side resistor Ra or the negative electrode power supply side resistor Rb (S112).

When it was determined that the ground fault state is established, for example, it is possible to judge where the ground fault occurs by measurement at the time of turning on and off the main relay, at the time of switch on/off for an A/C inverter, or at the time of switch on/off for a motor inverter, etc.

If the calculated insulation resistance RL does not fluctuate (S114: No), the relay sticking may occur, and in the same manner as the processing (S103), the freezing possibility is judged (S115). Then, if there is a possibility of freezing (S115: Yes), the relay is heated (S116), measurement is performed again (S101).

When there is no possibility of freezing (S115: No), it is determined that the power supply side sticking fault has occurred with twin relays (S117). Specifically, it is determined that when Vc1n is 0 V, the ground side sticking has occurred in the positive electrode side twin relay 111T, and that when Vc1p is 0 V, the ground side sticking has occurred in the negative electrode side twin relay 112T.

When the calculated insulation resistance RL is equal to the positive power source side resistor Ra, the positive electrode side twin relay 111T is determined to be stuck on the ground side, and when the calculated insulation resistance RL is equal to the negative electrode power supply side resistor Rb, the negative electrode side twin relay 112T is determined to be stuck on the ground side, but when the positive electrode power supply side resistor Ra is equal to the negative electrode power supply side resistor Rb, the positive electrode side twin relay 111T and the negative electrode side twin relay 112T are impossible to discriminate at this point.

As described above, according to the ground fault detection device 100 of the present embodiment, optical MOSFET, which causes cost increase, is not used as a switch for the measurement path to measure the ground fault, and therefore, it is possible to suppress an increase in cost caused by the switching element. Also, even when twin relay is used, switch faults due to relay sticking can be detected.

DESCRIPTION OF SYMBOLS 100 ground fault detection device
111 positive electrode side C contact switch
111T positive electrode side twin relay
112 negative electrode side C contact switch
112T negative electrode side twin relay
120 control device
300 high-voltage battery
C1 detection capacitor C1
R1 charge resistor
R2 discharge resistor
R3 positive electrode ground side resistor
R4 negative electrode ground side resistor
RLn negative electrode side insulation resistor
RLp positive electrode side insulation resistor
Ra positive electrode power supply side resistor
Rb negative electrode power supply side resistor

The invention claimed is:

1. A ground fault detection device that is connected to an ungrounded high-voltage battery and detects a ground fault of a system provided with the high-voltage battery, the ground fault detection device comprising:
    a controller;
    a detection capacitor operating as a flying capacitor;
    a positive electrode power supply side resistor configured to be connected to a positive electrode side of the high-voltage battery;
    a negative electrode power supply side resistor configured to be connected to a negative electrode side of the high-voltage battery;
    a positive electrode ground side resistor, one end of the positive electrode ground side resistor being grounded, a voltage of another end of the positive electrode ground side resistor being measured by the controller;
    a negative electrode ground side resistor, one end of the negative electrode ground side resistor being grounded;
    a positive electrode side twin relay connected in parallel with a relay for selectively switching a connection point of one end of the detection capacitor between a path including the positive electrode power supply side resistor and a path including the positive electrode ground side resistor; and
    a negative electrode side twin relay connected in parallel to a relay for selectively switching a connection point of another end of the detection capacitor between a path including the negative electrode power supply side resistor and a path including the negative electrode ground side resistor, wherein
    the controller controls switching of the positive electrode side twin relay and the negative electrode side twin relay, calculates an insulation resistance of the system provided with the high-voltage battery based on a charging voltage of the detection capacitor, and determines there is a possibility that a sticking fault on the power source side has occurred at the positive electrode side twin relay or the negative electrode side twin relay when the calculated insulation resistance can be regarded equal to a value of the positive electrode power supply side resistor or the negative electrode power supply side resistor.

2. The ground fault detection device according to claim 1, wherein
    the controller calculates the insulation resistance a plurality of times when determined that there is the possibility that the sticking fault on the power source side has occurred at the positive electrode side twin relay or the negative electrode side twin relay, and
    determines that not the sticking fault but a ground fault has occurred when the calculated insulation resistance fluctuates.

3. The ground fault detection device according to claim 2, wherein
    the controller calculates the insulation resistance a plurality of times when determined that there is the possibility that the sticking fault on the power source side has occurred at the positive electrode side twin relay or the negative electrode side twin relay, and determines the sticking fault on the power source side has occurred at the positive electrode side twin relay or the negative electrode side twin relay when the calculated insulation resistance remains stationary.

4. The ground fault detection device according to claim 3, wherein upon calculating the insulation resistance, the controller measures the charging voltage of the detection capacitor when switching to a circuit including the positive electrode power supply side resistor and the negative electrode ground side resistor, and the charging voltage of the detection capacitor when switching to a circuit including the negative electrode power supply side resistor and the positive electrode ground side resistor, and, when any one of charging voltages is 0, determines that the sticking fault on the ground side has occurred at the positive electrode side twin relay or the negative electrode side twin relay.

5. The ground fault detection device according to claim 4, wherein the controller, when determined that the sticking fault has occurred at the positive electrode side twin relay or the negative electrode side twin relay, further determines that there is a possibility of freezing.

6. The ground fault detection device according to claim 3, wherein the controller, when determined that the sticking fault has occurred at the positive electrode side twin relay or the negative electrode side twin relay, further determines that there is a possibility of freezing.

7. The ground fault detection device according to claim 2, wherein upon calculating the insulation resistance, the controller measures the charging voltage of the detection capacitor when switching to a circuit including the positive electrode power supply side resistor and the negative electrode ground side resistor, and the charging voltage of the detection capacitor when switching to a circuit including the negative electrode power supply side resistor and the positive electrode ground side resistor, and, when any one of charging voltages is 0, determines that the sticking fault on the ground side has occurred at the positive electrode side twin relay or the negative electrode side twin relay.

8. The ground fault detection device according to claim 7, wherein the controller, when determined that the sticking fault has occurred at the positive electrode side twin relay or the negative electrode side twin relay, further determines that there is a possibility of freezing.

9. The ground fault detection device according to claim 1, wherein the controller calculates the insulation resistance a plurality of times when determined that there is the possibility that the sticking fault on the power source side has occurred at the positive electrode side twin relay or the negative electrode side twin relay, and determines the sticking fault on the power source side has occurred at the positive electrode side twin relay or the negative electrode side twin relay when the calculated insulation resistance remains stationary.

10. The ground fault detection device according to claim 9, wherein upon calculating the insulation resistance, the controller measures the charging voltage of the detection capacitor when switching to a circuit including the positive electrode power supply side resistor and the negative electrode ground side resistor, and the charging voltage of the detection capacitor when switching to a circuit including the negative electrode power supply side resistor and the positive electrode ground side resistor, and, when any one of charging voltages is 0, determines that the sticking fault on the ground side has occurred at the positive electrode side twin relay or the negative electrode side twin relay.

11. The ground fault detection device according to claim 10, wherein the controller, when determined that the sticking fault has occurred at the positive electrode side twin relay or the negative electrode side twin relay, further determines that there is a possibility of freezing.

12. The ground fault detection device according to claim 9, wherein the controller, when determined that the sticking fault has occurred at the positive electrode side twin relay or the negative electrode side twin relay, further determines that there is a possibility of freezing.

13. The ground fault detection device according to claim 1, wherein upon calculating the insulation resistance, the controller measures the charging voltage of the detection capacitor when switching to a circuit including the positive electrode power supply side resistor and the negative electrode ground side resistor, and the charging voltage of the detection capacitor when switching to a circuit including the negative electrode power supply side resistor and the positive electrode ground side resistor, and, when any one of charging voltages is 0, determines that the sticking fault on the ground side has occurred at the positive electrode side twin relay or the negative electrode side twin relay.

14. The ground fault detection device according to claim 13, wherein the controller, when determined that the sticking fault has occurred at the positive electrode side twin relay or the negative electrode side twin relay, further determines that there is a possibility of freezing.

* * * * *